United States Patent
Hong et al.

(10) Patent No.: US 10,525,566 B2
(45) Date of Patent: Jan. 7, 2020

(54) PREPARING CONDITIONING DISK FOR CHEMICAL MECHANICAL POLISHING AND CHEMICAL MECHANICAL POLISHING METHOD INCLUDING THE SAME

(71) Applicant: SAMSUNG ELECTRONICS CO., LTD., Suwon-si, Gyeonggi-do (KR)

(72) Inventors: Myung-ki Hong, Anyang-si (KR);
Yung-jun Kim, Yongin-si (KR);
Sung-oh Park, Suwon-si (KR);
Hyo-san Lee, Hwaseong-si (KR);
Joo-han Lee, Seongnam-si (KR);
Kyu-min Oh, Suwon-si (KR); Sun-gyu Park, Seoul (KR); Seh-kwang Lee, Yongin-si (KR); Chan-ki Yang, Hwaseong-si (KR)

(73) Assignees: SAMSUNG ELECTRONICS CO., LTD., Suwon-si, Gyeonggi-do (KR);
EHWA Diamond Industrial Co., Ltd., Osan-si, Gyeonggi-do (KR)

( * ) Notice: Subject to any disclaimer, the term of this patent is extended or adjusted under 35 U.S.C. 154(b) by 116 days.

(21) Appl. No.: 15/602,256

(22) Filed: May 23, 2017

(65) Prior Publication Data

US 2018/0104792 A1    Apr. 19, 2018

(30) Foreign Application Priority Data

Oct. 18, 2016  (KR) .................. 10-2016-0135263

(51) Int. Cl.
*B24B 53/017* (2012.01)
*B24B 37/04* (2012.01)
(Continued)

(52) U.S. Cl.
CPC .......... *B24B 53/017* (2013.01); *B24B 37/005* (2013.01); *B24B 37/042* (2013.01);
(Continued)

(58) Field of Classification Search
CPC ...... H01L 22/20; B24B 37/042; B24B 53/017
See application file for complete search history.

(56) References Cited

U.S. PATENT DOCUMENTS 6,439,986 B1   8/2002  Myoung et al.
7,150,675 B2  12/2006  Kramer et al.
(Continued)

FOREIGN PATENT DOCUMENTS

KR    10-1415982 B1    7/2014
KR    10-2016-0051219 A    5/2016

*Primary Examiner* — Mohsen Ahmadi
*Assistant Examiner* — Christopher M Roland
(74) *Attorney, Agent, or Firm* — Lee & Morse, P.C.

(57) ABSTRACT

A chemical mechanical polishing (CMP) method includes preparing a polishing pad, determining a first load to be applied to a conditioning disk during conditioning of the polishing pad and a first indentation depth at which tips of the conditioning disk are inserted into the polishing pad when the first load is applied to the conditioning disk, preparing a conditioning disk, and positioning the conditioning disk on the polishing pad and conditioning a surface of the polishing pad by using the conditioning disk while applying the first load to the conditioning disk.

17 Claims, 22 Drawing Sheets

(51) Int. Cl.
*H01L 21/321* (2006.01)
*H01L 21/66* (2006.01)
*B24B 37/005* (2012.01)
*H01L 21/768* (2006.01)

(52) U.S. Cl.
CPC ...... *H01L 21/3212* (2013.01); *H01L 21/7684* (2013.01); *H01L 21/76802* (2013.01); *H01L 21/76843* (2013.01); *H01L 21/76877* (2013.01); *H01L 22/12* (2013.01); *H01L 22/20* (2013.01)

(56) References Cited

U.S. PATENT DOCUMENTS

| | | |
|---|---|---|
| 7,840,305 B2 | 11/2010 | Behr et al. |
| 8,257,142 B2 | 9/2012 | Muldowney et al. |
| 8,662,956 B2 | 3/2014 | Seo et al. |
| 9,138,860 B2 | 9/2015 | Dhandapani et al. |
| 2002/0115385 A1* | 8/2002 | Misra ............... B24B 37/24 451/41 |
| 2012/0270474 A1 | 10/2012 | Liao et al. |
| 2012/0270477 A1 | 10/2012 | Nangoy et al. |
| 2013/0217306 A1* | 8/2013 | Wu ............... B24B 49/16 451/9 |
| 2013/0225052 A1 | 8/2013 | Song et al. |
| 2014/0154960 A1 | 6/2014 | Lee et al. |
| 2014/0335761 A1 | 11/2014 | Chou et al. |
| 2015/0140900 A1* | 5/2015 | Lee ............... B24B 37/005 451/5 |
| 2015/0209933 A1 | 7/2015 | Lehuu et al. |

* cited by examiner

PREPARING CONDITIONING DISK FOR CHEMICAL MECHANICAL POLISHING AND CHEMICAL MECHANICAL POLISHING METHOD INCLUDING THE SAME

CROSS-REFERENCE TO RELATED APPLICATION

Korean Patent Application No. 10-2016-0135263, filed on Oct. 18, 2016, in the Korean Intellectual Property Office, and entitled: "Chemical Mechanical Polishing Method, Method of Manufacturing Semiconductor Device and Semiconductor Manufacturing Apparatus," is incorporated by reference herein in its entirety.

BACKGROUND

1. Field

Embodiments relate to a chemical mechanical polishing method, a method of manufacturing a semiconductor device, and a semiconductor manufacturing apparatus.

2. Description of the Related Art

A chemical mechanical polishing (CMP) process is a process of evenly polishing a surface of a wafer by using a chemical reaction and a mechanical force during a semiconductor manufacturing process. In recent years, the CMP process has been widely used for manufacturing semiconductor devices having a multilayer wiring structure. During the CMP process, a wafer is polished flat by friction between a polishing pad and the wafer, and in this case, pad conditioning for finely cutting the surface of the polishing pad is performed in order to maintain a constant condition of the polishing pad.

SUMMARY

According to an aspect of embodiments, there is provided a chemical mechanical polishing (CMP) method including preparing a polishing pad, determining a first load to be applied to a conditioning disk during conditioning of the polishing pad and a first indentation depth at which tips of the conditioning disk are inserted into the polishing pad when the first load is applied to the conditioning disk, preparing a conditioning disk, and positioning the conditioning disk on the polishing pad and conditioning a surface of the polishing pad by using the conditioning disk while applying the first load to the conditioning disk.

According to another aspect of embodiments, there is provided a method of manufacturing a semiconductor device, including forming a first material layer having a recessed portion on a semiconductor substrate, forming a second material layer different from the first material layer in the recess portion and on an entire surface of the first material layer, and performing a chemical mechanical polishing (CMP) process on the second material layer to confine the second material layer in the recessed portion, wherein the performing the CMP process includes: conditioning a polishing pad by rubbing a conditioning disk and the polishing pad together, and polishing the first material layer by rubbing the polishing pad and the semiconductor substrate together while supplying a slurry for chemical mechanical polishing between the polishing pad and the semiconductor substrate, wherein the conditioning the polishing pad includes: preparing the polishing pad, determining a permissible range of an indentation depth according to a hardness of the polishing pad and a conditioning load, positioning the conditioning disk on the polishing pad and then measuring a first depth at which tips of the conditioning disk are inserted into the polishing pad by applying the conditioning load to the conditioning disk, and determining whether the first depth is within the permissible range of the indentation depth.

According to yet another aspect of embodiments, there is provided a semiconductor manufacturing apparatus including an indentation depth measuring apparatus for measuring an indentation depth at which tips of a conditioning disk are inserted into a polishing pad by applying a conditioning load to the conditioning disk, wherein the indentation depth measuring apparatus includes: a support plate on which the polishing pad and the conditioning disk positioned on the polishing pad are placed, a pressing device configured to apply the conditioning load to the conditioning disk to insert the tips of the conditioning disk into the polishing pad, and a height sensor configured to measure the indentation depth.

According to still another aspect of embodiments, there is provided a semiconductor manufacturing apparatus including a chemical mechanical polishing (CMP) apparatus including a platen on which a polishing pad having a first hardness is seated, and a pad conditioner mounted with a conditioning disk having a plurality of tips and configured to condition the polishing pad by applying a first load to the conditioning disk to insert the plurality of tips into the polishing pad and cutting a surface of the polishing pad with the plurality of tips, and a controller configured to determine a first indentation depth at which the plurality of tips are inserted into the polishing pad while the polishing pad is conditioned, according to the first hardness and the first load.

According to yet another aspect of embodiments, there is provided a CMP method, including preparing a polishing pad, determining a permissible range of a first indentation depth according to a hardness of the polishing pad and a first load, preparing a conditioning disk, and conditioning the polishing pad by rubbing the polishing pad with the conditioning disk, while applying the first load to the conditioning disk, such that tips of the conditioning disk are inserted into the polishing pad at the permissible range of the first indentation depth, and polishing a predetermined material layer by rubbing the predetermined material layer with the conditioned polishing pad, while supplying a slurry between the polishing pad and the predetermined material layer.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Hereinafter, embodiments will be described in detail with reference to the accompanying drawings.

Figure 1A:
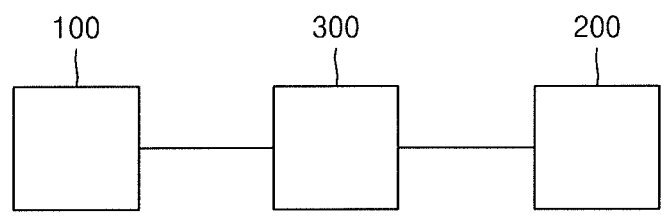
FIGS. 1A and 1B illustrate block diagrams of semiconductor manufacturing apparatuses according to some embodiments.
Figure 1B:
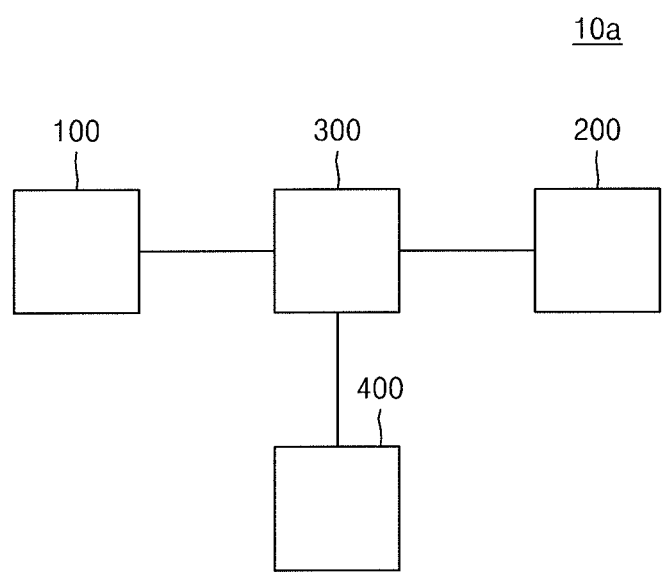

FIGS. 1A and 1B are block diagrams of semiconductor manufacturing apparatuses 10 and 10a according to some embodiments.

Referring to FIG. 1A, the semiconductor manufacturing apparatus 10 may include an indentation depth measuring apparatus 100, a chemical mechanical polishing (CMP) apparatus 200, and a controller 300.

The indentation depth measuring apparatus 100 may measure an indentation depth, which is a depth at which tips of a conditioning disk are inserted into a polishing pad as a predetermined load is applied to the conditioning disk. The indentation depth measuring apparatus 100 may determine an indentation depth during a CMP process in the CMP apparatus 200 by applying a conditioning load to the conditioning disk. The conditioning load refers to a load applied to the conditioning disk while a polishing pad is conditioned using the condition disk in the CMP apparatus 200. For example, the indentation depth measuring apparatus 100 may measure the indentation depth by positioning the conditioning disk on the polishing pad and then applying the same load as the conditioning load to the conditioning disk and measuring a change in a surface height level of the conditioning disk before and after the conditioning load is applied.

The CMP apparatus 200 may perform a CMP process to evenly polish the surface of a wafer by using a chemical reaction and a mechanical force. During the CMP process, the wafer rubs against the polishing pad and thus is polished. Thus, in order to prevent the surface of the polishing pad, which has micro-pores, from being clogged with slurry or other foreign matter, the CMP apparatus 200 performs a pad conditioning process for continuously finely cutting the surface of the polishing pad to keep the state of the polishing pad at an initial state.

The term "wafer" as used in the present specification refers to a wafer in a semiconductor manufacturing process or a wafer on which the semiconductor manufacturing process has been completed. That is, the wafer may include one or more various material layers (e.g., insulating layer, conductive layer, resist layer, etc.) that may be formed on a substrate.

The CMP apparatus 200 may perform a test CMP process for evaluating the efficiency of a CMP process in addition to performing a CMP process for producing semiconductor devices. For example, the CMP apparatus 200 may evaluate the characteristics of a CMP process by measuring the occurrence of vibration or noise during a test CMP process. When the CMP apparatus 200 performs a test CMP process, the CMP apparatus 200 may use a plurality of test conditioning disks including tips having different structures and may observe a change in the characteristics of a CMP process according to an indentation depth.

The controller 300 may communicate with the indentation depth measuring apparatus 100 and the CMP apparatus 200. The controller 300 may transmit the value of the conditioning load to the indentation depth measuring apparatus 100 and may receive the value of an indentation depth measured by the indentation depth measuring apparatus 100. Also, the controller 300 may transmit the value of the conditioning load to the CMP apparatus 200 and may receive information from the CMP apparatus 200 to evaluate the characteristics of a CMP process. The controller 300 may be configured to determine an indentation depth for performing a CMP process having improved polishing characteristics based on information transmitted from the indentation depth measuring apparatus 100 and the CMP apparatus 200.

Referring to FIG. 1B, the semiconductor manufacturing apparatus 10a may have substantially the same configuration as the semiconductor manufacturing apparatus 10 of FIG. 1A, except that it further includes a wafer observation apparatus 400. In FIG. 1B, the same reference numerals as in FIG. 1A denote the same members, and redundant descriptions are omitted or simplified.

The wafer observation apparatus 400 may observe the surface of a wafer polished by a CMP process performed in the CMP apparatus 200 and may include various types of optical apparatuses suitable for observing the surface of the wafer. The wafer observation apparatus 400 may transmit information for evaluating the characteristics of a CMP process to the controller 300. For example, through the wafer observation apparatus 400, a removal rate and the number of scratches on a wafer surface may be observed. The controller 300 may be configured to determine an indentation depth for performing a CMP process having improved polishing characteristics based on information transmitted from the indentation depth measuring apparatus 100 and the wafer observation apparatus 400.

Figure 2A:
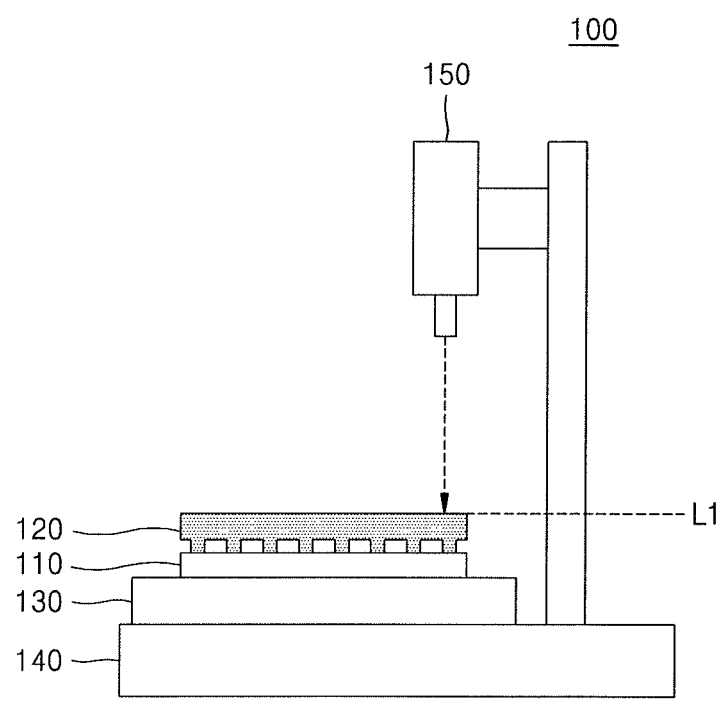
FIGS. 2A and 2B illustrate side views of indentation depth measuring apparatuses according to some embodiments.
Figure 2B:
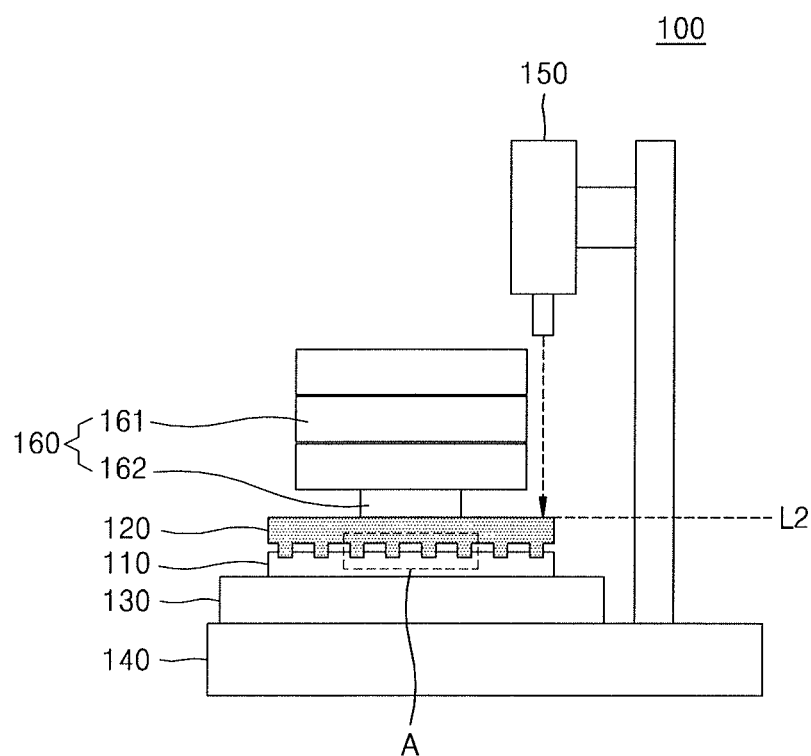

FIGS. 2A and 2B are side views of the indentation depth measuring apparatus 100 according to some embodiments. FIGS. 2A and 2B are views of the indentation depth measuring apparatus 100 before and after a load is applied to a conditioning disk 120, respectively.

Referring to FIGS. 2A and 2B, the indentation depth measuring apparatus 100 may include a support plate 140, on which a polishing pad 110 and the conditioning disk 120 are mounted, a height sensor 150 for measuring an indentation depth, and a temperature controller 130 for adjusting the surface temperature of the polishing pad 110. A pressing device 160 applies a predetermined load to the conditioning disk 120, as illustrated in FIG. 2B.

In detail, the support plate 140 may have a constant flatness, e.g., the support plate 140 may have a substantially flat top surface facing the polishing pad 110. The polishing pad 110 may be disposed on the surface of the support plate 140, and the conditioning disk 120 may be positioned on the polishing pad 110 so that tips (e.g., tips 123 of FIG. 3) of the conditioning disk 120 contact, e.g., a top surface of, the polishing pad 110, e.g., the polishing pad 110 may be between the tips of the conditioning disk 120 and the support plate 140.

The pressing device 160 may apply a predetermined load to the conditioning disk 120. The pressing device 160 may include a load control unit 161 and a load transfer unit 162.

The load control unit 161 may adjust a load that is applied to the conditioning disk 120. The load control unit 161 may apply a load to the conditioning disk 120 by using a weight and may adjust a load, which is applied to the conditioning disk 120, by adjusting the number of weights or the weight. However, the configuration of the load control unit 161 is not limited thereto, e.g., the load control unit 161 may include a pneumatic cylinder or a hydraulic cylinder capable of applying a load to the conditioning disk 120 by using pneumatic or hydraulic pressure.

The load transfer unit 162 is disposed between the load control unit 161 and the conditioning disk 120. A load generated by the load control unit 161 may be transmitted to the conditioning disk 120 through the load transfer unit 162. The load transfer unit 162 may apply a load to the conditioning disk 120 in the same manner like in a pad conditioning process performed by a CMP apparatus. For example, the load transfer unit 162 may have the same shape and dimension as a pressure cylinder of a pad conditioner provided in the CMP apparatus. For example, the load transfer unit 162 may have a cylindrical shape.

The temperature controller 130 may be disposed to be connected to the polishing pad 110, e.g., the temperature controller 130 may be between the support plate 140 and the polishing pad 110. The temperature controller 130 may adjust the temperature of the polishing pad 110. For example, the temperature controller 130 may heat or cool the polishing pad 110 to adjust the surface temperature of the polishing pad 110 so that the surface temperature of the polishing pad 110 is equal to the surface temperature of the polishing pad 110 when a CMP process is performed in the CMP apparatus.

The height sensor 150 may measure a depth at which a tip of the conditioning disk 120 is inserted into the polishing pad 110 as a load is applied to the conditioning disk 120. For example, the height sensor 150 may be a non-contact type sensor, e.g., an eddy current sensor, an optical sensor, or an ultrasonic sensor, or may be a contact type sensor, e.g., a digimatic height gauge. The height sensor 150 may measure a height level difference of the, e.g., top, surface of the conditioning disk 120 before and after a load is applied to the conditioning disk 120 to obtain the depth at which the tip of the conditioning disk 120 is inserted into the polishing pad 110.

In detail, as shown in FIG. 2A, the polishing pad 110 is placed on the support plate 140, and the conditioning disk 120 is disposed on the polishing pad 110 so that the tips of the conditioning disk 120 contact, e.g., directly contact, the top surface of the polishing pad 110. Then, the height level of the top surface, e.g., a surface facing the height sensor 150, of the conditioning disk 120 is measured using the height sensor 150 to obtain a first height (i.e., L1 in FIG. 2A).

Next, as shown in FIG. 2B, a predetermined load is applied to the conditioning disk 120 by using the pressing device 160. That is, the pressing device 160 is positioned on the top surface of the conditioning disk 120, so the tips of the conditioning disk 120 may be inserted into the polishing pad 110. Then, the height level of the top surface of the conditioning disk 120 is measured using the height sensor 150 to obtain a second height (i.e., L2 in FIG. 2B). An indentation depth may be calculated as a difference between the first height and the second height.

Figure 3:
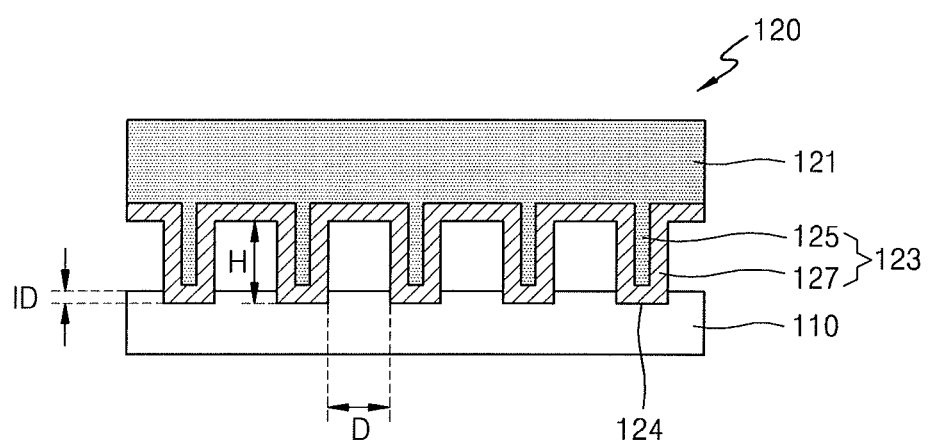
FIG. 3 illustrates an enlarged view of a part A of FIG. 2B according to some embodiments.

FIG. 3 is an enlarged view of a part A of FIG. 2B.

Referring to FIG. 3, the conditioning disk 120 may be a chemical vapor deposition (CVD) type conditioning disk including a base 121 and a plurality of tips 123 protruding from the surface of the base 121.

The base 121 may include a material having high strength and hardness, e.g., a ceramic material, a silicon material, or stainless steel. The base 121 may have a disk shape.

The tips 123 may include protruding patterns 125 formed on the base 121 and a coating layer 127 formed to cover the surface of the base 121, exposed between the protruding patterns 125, and the surfaces of the protruding patterns 125. The protruding patterns 125 may be formed integrally with the base 121, e.g., made of a same material to define a single and seamless unit. For example, the base 121 and the protruding patterns 125 may be formed integrally by preparing a substrate having a predetermined thickness and performing a patterning process or laser drilling to remove a part of the prepared substrate.

The coating layer 127 may be formed, e.g., conformally, by performing a CVD process to deposit a thin film on the surfaces of the protruding patterns 125 and the surface of the base 121 exposed between the protruding patterns 125. The coating layer 127 may include, e.g., diamond particles. The conditioning disk 120 with the coating layer 127 formed by the CVD process may have a relatively uniform height, e.g., the distribution of the height H of the tips 123 may be within 5 μm. While a pad conditioning process is performed on the polishing pad 110, the coating layer 127 finely cuts the surface of the polishing pad 110 while rubbing against the polishing pad 110.

In some embodiments, after an indentation depth (ID) suitable for carrying out a CMP process with improved polishing characteristics is determined, the structure of the tips 123 may be determined so that the tips 123 may be inserted at the determined indentation depth (ID) during the CMP process. Determining the structure of the tips 123 may mean determining the number, shape, dimension, and arrangement of the tips 123. In addition, determining the dimension of the tips 123 may mean determining the breadthwise width, lengthwise width, and height of the tips 123. Further, determining the arrangement of the tips 123 may include determining an interval between the tips 123 and a position at which the tips 123 are disposed.

For example, each of the tips 123 may have the shape of a rectangular parallelepiped, a cylinder, a triangular pyramid, a quadrangular pyramid, a cone, or the like. The edge of each of the tips 123 and the surface of the polishing pad 110 may be in surface contact, line contact, or point contact with each other.

For example, the height H of the tips 123 may be constant. For example, the height H of the tips 123 may be determined to be 200 μm or less.

For example, the total area of the tips 123 provided in the conditioning disk 120 may be determined to be about 0.9 mm$^2$ to about 75 mm$^2$. The total area of the tips 123 may denote the total area of the lower surfaces 124 of the tips 123.

For example, an interval D between the tips 123 may be determined to be about 0.1 mm to about 2 mm. The tips 123 serve to sweep off byproducts generated during a pad conditioning process to the periphery of the polishing pad 110 and a space between the tips 123 functions as a passage through which the byproducts generated in the pad conditioning process, e.g., cutting of the polishing pad 110, may be discharged. Thus, the interval D between the tips 123 needs to be adjusted to be in an appropriate range. The interval D between the tips 123 may denote a distance between the edges of adjacent tips 123. That is, when the interval D between the tips 123 is less than 0.1 mm, byproducts of the pad conditioning process may not be properly discharged and scratches may be generated on the surface of a polished wafer due to the byproducts. When the interval D between the tips 123 is greater than 2 mm, it may be difficult to effectively sweep off byproducts remaining on the surface of the polishing pad 110 to the periphery of the polishing pad 110.

For example, the tips 123 may be arranged equidistantly. The conditioning disk 120 with the tips 123 arranged equidistantly may be used to apply even, e.g., uniform, pressure to the surface of the polishing pad 110 being conditioned.

For example, the tips 123 may be arranged at different intervals. In some embodiments, an interval between tips disposed in central regions of the bottom surface of the conditioning disk 120 may be greater than an interval between tips disposed in edge regions of the bottom surface of the conditioning disk 120. By relatively increasing the interval between the tips disposed in the central regions, it may be advantageous for the byproduct to be discharged into the space between the tips of the central regions without staying in the central regions.

Figure 4A:
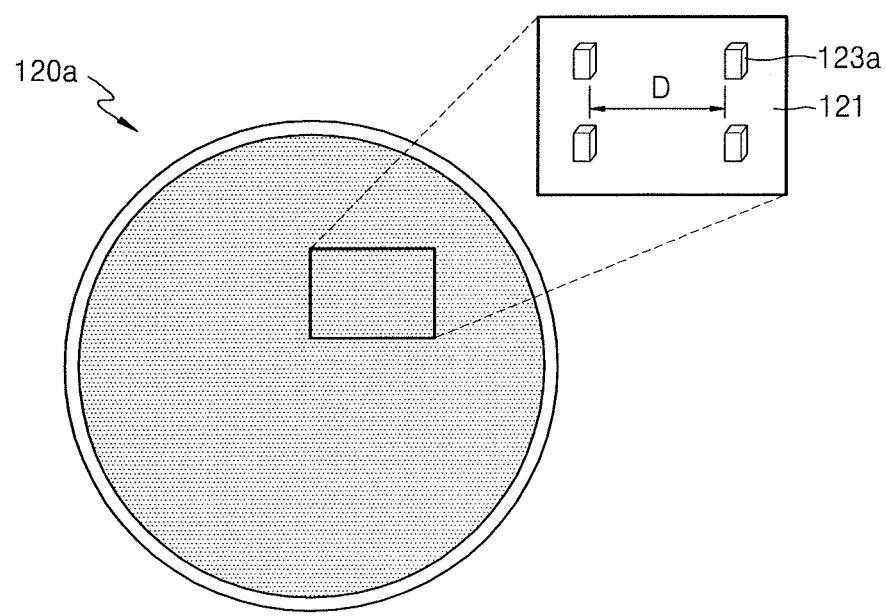
FIGS. 4A and 4B illustrate plan views of the bottom surfaces of conditioning disks according to some embodiments.
Figure 4B:
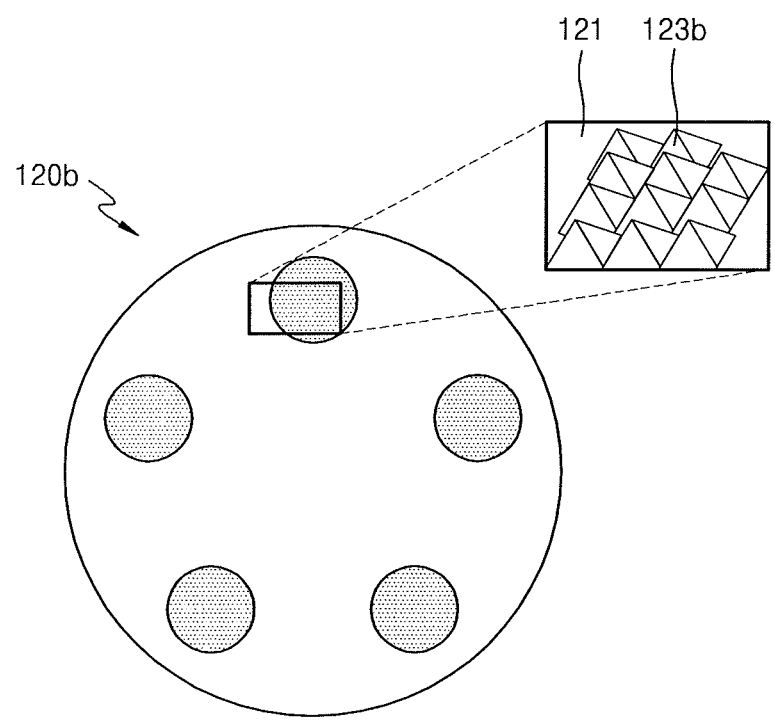

FIGS. 4A and 4B are plan views of the bottom surfaces of conditioning disks 120a and 120b according to some embodiments.

Referring to FIG. 4A, tips 123a of the conditioning disk 120a may be disposed throughout the entire bottom surface of the conditioning disk 120a (shaded area in the conditioning disk 120a). For example, the tips 123a may be evenly arranged over the bottom surface of the conditioning disk 120a in a lattice shape, as illustrated in the enlarged portion in FIG. 4A. As shown in FIG. 4A, the tips 123a may have a rectangular parallelepiped shape, but are not limited thereto.

Referring to FIG. 4B, tips 123b of the conditioning disk 120b may be disposed only in a portion of the bottom surface of the conditioning disk 120b. In some embodiments, the tips 123b may be locally disposed in a plurality of regions of the bottom surface of the conditioning disk 120b. In this case, the plurality of regions may be disposed near the edge of the bottom surface of the conditioning disk 120b, and the plurality of regions may be equally spaced, as illustrated by the shaded portion in FIG. 4B.

As shown in FIG. 4B, the tips 123b may have a triangular pyramid shape and may be arranged to be connected to each other without a gap, as illustrated in the enlarged portion of FIG. 4B. However, the shapes of the tips 123b are not limited thereto, and the tips 123b may be arranged to be spaced apart from each other.

In some cases, the conditioning for a polishing pad may be more actively performed in a region closer to the edge of the bottom surface of the conditioning disk 120b than a central region of the bottom surface of the conditioning disk 120b, and thus, the degree of abrasion of the tips 123b in the region closer to the edge may be different than that of abrasion of the tips 123b in the central region. In this case, as shown in FIG. 4B, the tips 123b may be locally disposed in the region closer to the edge except for the central region, thereby making it possible to prevent uneven conditioning for the polishing pad.

Figure 5:
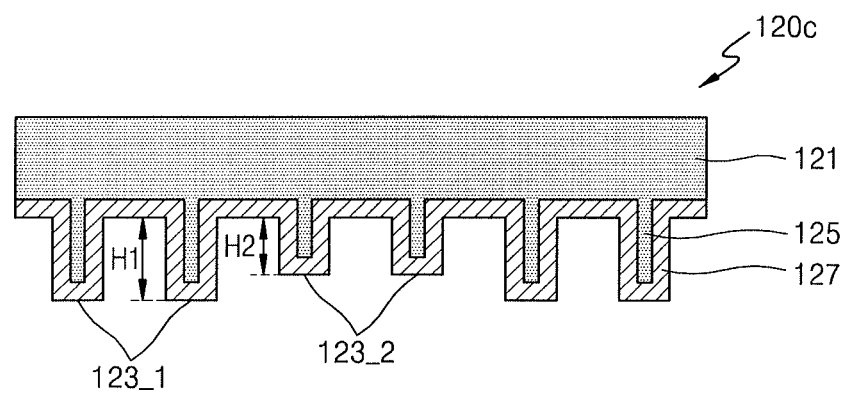
FIG. 5 illustrates a cross-sectional view of a portion of a conditioning disk according to some embodiments.

FIG. 5 is a cross-sectional view of a portion of a conditioning disk 120c according to some embodiments.

Referring to FIG. 5, the conditioning disk 120c may include the base 121 and tips in a multi-stepped structure. For example, the tips may include first tips 123_1 having a first height H1 and second tips 123_2 having a second height H2 less than the first height H1. The first tips 123_1 and the second tips 123_2 may be alternately arranged.

When the height of the first tips 123_1 is greater than the height of the second tips 123_2, only the first tips 123_1 may be involved in the cutting of the polishing pad during an initial stage of a pad conditioning process, and the first tips 123_1 and the second tips 123_2 may be involved in the cutting of the polishing pad as the first tips 123_1 are worn out after a certain time has elapsed. That is, when a certain period of time has elapsed since the beginning of the pad conditioning process, the number of tips involved in the cutting of the polishing pad may increase.

When the pad conditioning process is continued for a certain time, the surface temperature of the polishing pad may rise and the hardness of the polishing pad may decrease. As a result, as compared to the initial stage of the pad conditioning process, the pad conditioning process may proceed in a state in which the tips are excessively inserted into the polishing pad.

However, when the heights of the tips are different from each other, the number of tips involved in the cutting of the polishing pad is relatively increased with time, even though the hardness of the polishing pad decreases over time. Thus, the pressure per tip becomes relatively low. In other words, a same pressure distributed over the increased number of tips decreases the pressure applied to each tip, thereby decreasing the insertion depth of each tip. Accordingly, it is possible to prevent excessive insertion of the tips into the polishing pad after a lapse of a certain time.

Although FIG. 5 exemplifies that the tips are formed to have two different heights, the configuration of the tips is not limited thereto. For example, the tips of the multi-stepped structure may be configured to have three or more different heights.

Figure 6:
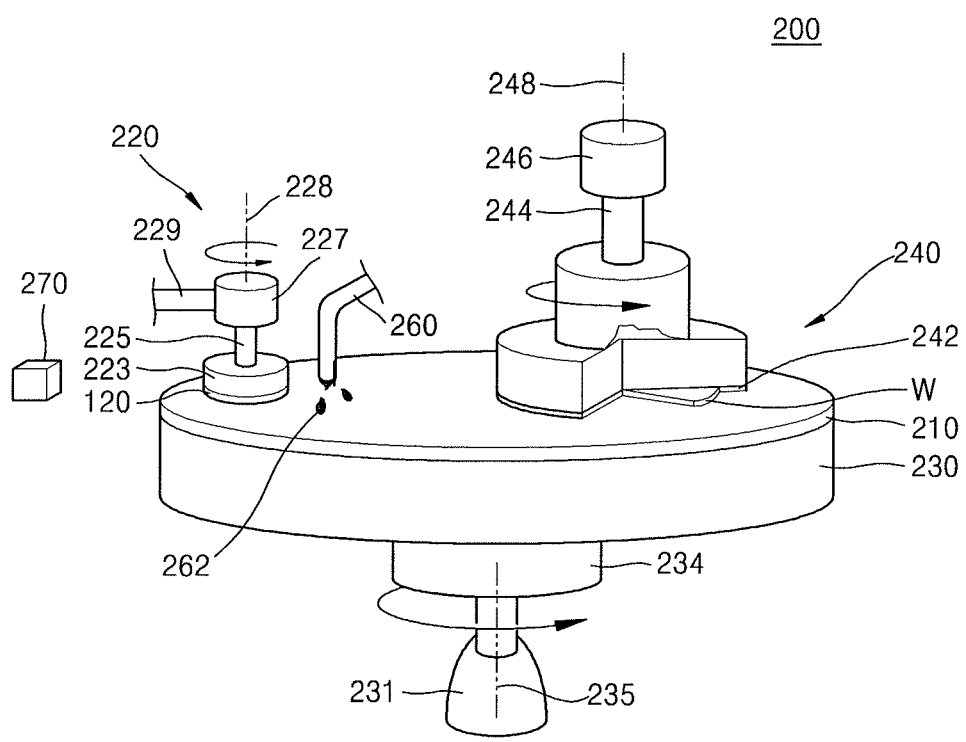
FIG. 6 illustrates a perspective view of a CMP apparatus according to some embodiments.

FIG. 6 is a perspective view of a CMP apparatus 200 according to some embodiments.

Referring to FIG. 6, the CMP apparatus 200 may include a platen 230 on which a polishing pad 210 is placed, a carrier head 240 on which a wafer W is mounted, a pad conditioner 220 for cutting the polishing pad 210 to maintain the surface of the polishing pad 210 in a consistent polishing state, a slurry supply unit 260, and a sensor 270 for measuring vibration or noise.

The platen 230 is mounted with the polishing pad 210 on the upper side thereof and may have, e.g., a disk shape. The platen 230 may be operable to rotate relative to an axis 235. For example, a motor 231 may rotate a drive shaft 234 to rotate the platen 230. The polishing pad 210 may be a pad including, e.g., polyurethane.

The carrier head 240 is mounted with the wafer W in a direction facing the polishing pad 210, e.g., the carrier head 240 may hold the wafer W in a vacuum adsorption manner, e.g., via suction. The carrier head 240 may also include a retaining ring 242 for holding the wafer W to prevent the wafer W from disengaging.

The carrier head 240 may rub the wafer W and the polishing pad 210 together at a predetermined pressure while a CMP process is performed. The carrier head 240 may control polishing parameters, e.g., pressure, associated with each individual wafer W. The carrier head 240 may be connected to a carrier head rotary motor 246 by a drive shaft 244 and may be rotationally driven relative to an axis 248. Although only one carrier head 240 is shown in FIG. 6, two or more carrier heads 240 may be provided to hold two or more wafers W to polish two or more wafers W at the same time.

The CMP apparatus 200 may include the slurry supply unit 260 for dispensing a slurry 262, e.g., a solution including abrasive particles, toward the polishing pad 210. The slurry supply unit 260 may be installed on, e.g., above, the polishing pad 210. The slurry supply unit 260 may include a slurry supply nozzle for supplying the slurry 262 to the upper surface of the polishing pad 210 during a CMP process. The slurry 262 may contain an oxidizing agent, a hydroxylating agent, abrasive particles, a surfactant, a dispersing agent, and other catalysts. The slurry 262 may chemically change the surface of the wafer W. The abrasive particles contained in the slurry 262 may mechanically polish the wafer W. For example, the abrasive particles may include silica, alumina, zirconia, or ceria particles, but the composition of the abrasive particles is not limited thereto.

The pad conditioner 220 may include the conditioning disk 120 and a disk holder 223. The pad conditioner 220 is disposed on the polishing pad 210 and may be installed around the carrier head 240.

The disk holder 223 may hold the conditioning disk 120. Although not shown in FIG. 6, a pressure cylinder for vertically pressing the disk holder 223 and the conditioning disk 120 by using pneumatic or hydraulic pressure may be installed at one side of the disk holder 223. The disk holder 223 may be connected to a disk holder rotary motor 227 by the drive shaft 225, and the disk holder 223 and the conditioning disk 120 may be rotationally driven with respect to an axis 228 by the disk holder rotary motor 227. In addition, the disk holder 223 may be configured to be translated laterally with respect to the surface of the polishing pad 210 by an arm 229.

The conditioning disk 120 may have tips (e.g. the tips 123 in FIG. 3) on the bottom surface thereof, which are inserted into the polishing pad 210 by a predetermined depth during a pad conditioning process, as shown in FIG. 3. During the pad conditioning process, a conditioning load is applied to the conditioning disk 120 such that the lower portions of the tips are inserted into the polishing pad 210, and the tips finely cut the polishing pad 210 while the conditioning disk 120 is rotated and translated.

The sensor 270 may include a vibration sensor or a noise sensor, and may measure a vibration level or a noise level that occurs during a test CMP process in the CMP apparatus 200. For example, during the test CMP process, as a depth at which the tips of the conditioning disk 120 are inserted into the polishing pad 210 increase, a contact area between the tips and the polishing pad 210 increases. In this case, when an indentation depth is equal to or greater than a certain value, a frictional force between the tips and the polishing pad 210 increases, and thus, the conditioning disk 120 and/or a structure supporting the conditioning disk 120 may vibrate and the test CMP process may be unstable.

Information on vibration or noise measured by the sensor 270 may be used to evaluate the efficiency of the test CMP process. For example, when the vibration measured by the sensor 270 exceeds a reference value and/or when the noise measured by the sensor 270 exceeds a reference value, it may be estimated that the test CMP process is unstable. Vibration occurrence information or noise occurrence information obtained from the test CMP process may be used to determine an indentation depth to be applied to an actual CMP process, which will be described later in detail with reference to FIGS. 8A and 8B.

Figure 7:
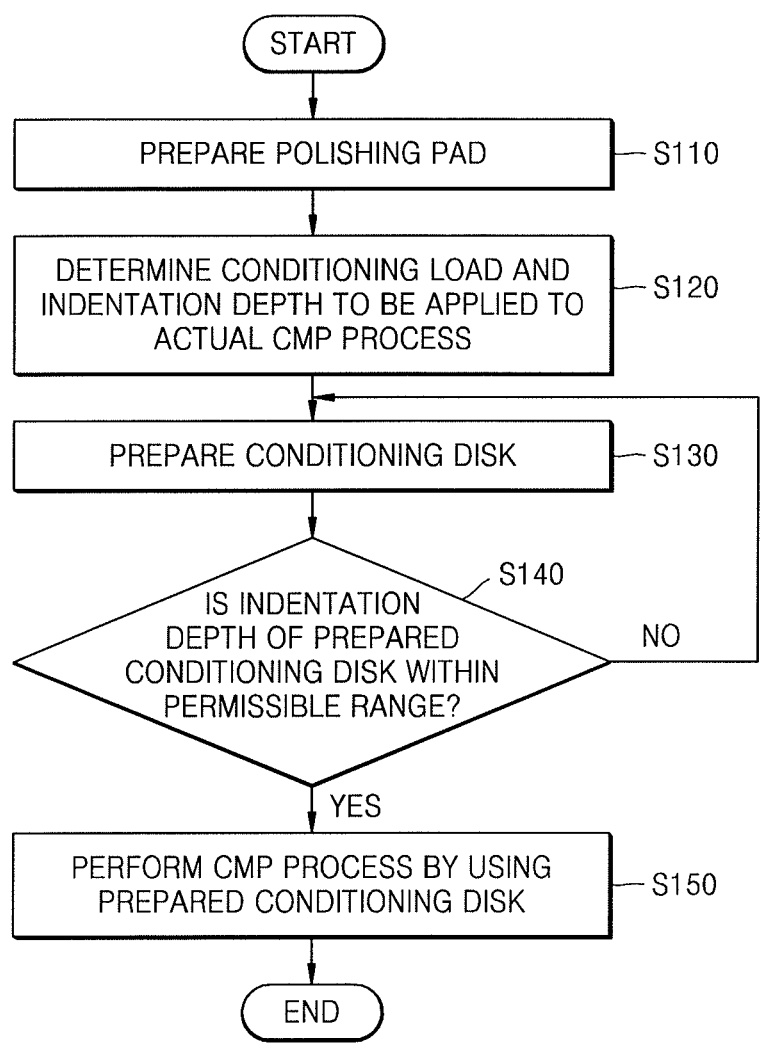
FIG. 7 illustrates a flowchart of a CMP method according to some embodiments.

FIG. 7 is a flowchart sequentially illustrating a CMP method according to some embodiments.

Referring to FIG. 7, in the CMP method, a polishing pad is first prepared (operation S110). In this case, preparing the polishing pad includes preparing a polishing pas having hardness suitable for performing a specific CMP process, e.g., the polishing pad may be determined based on its hardness in a accordance with a material required to be chemically mechanically polished.

Next, a conditioning load and an indentation depth to be applied to an actual CMP process are determined (operation S120). Hereinafter, for convenience of explanation, the indentation depth to be applied to the actual CMP process is referred to as a first indentation depth. The first indentation depth may be determined according to the conditioning load, the hardness of the polishing pad, and the structure of tips provided in a conditioning disk. The first indentation depth may be related to the magnitude of a frictional force between the tips of the conditioning disk and the polishing pad. When the first indentation depth is equal to or less than a certain level, the wear rate of the polishing pad is too small to adequately condition the polishing pad. On the contrary, when the first indentation depth is greater than the certain level, an unstable CMP process proceeds. Thus, the first indentation depth needs to be controlled to be within a certain range in consideration of conditioning conditions such as the size of the conditioning load and the hardness of the polishing pad.

In order to determine the first indentation depth, information obtained by measuring vibration or noise occurring during a test CMP process may be used, or information obtained by analyzing wafers subjected to the test CMP process may be used. This will be described in detail with reference to FIG. 8C and FIG. 9E later.

Next, a conditioning disk is prepared (operation S130). In order to prepare a suitable conditioning disk, the type of polishing pad determined previously, the conditioning load, and the first indentation depth may be considered. More specifically, a conditioning disk, which has tips of a structure suitable for being inserted into the polishing pad by the first indentation depth when the conditioning load is applied to an actual CMP process, may be selected.

In some embodiments, preparing the conditioning disk may include determining the structure of the tips of the conditioning disk to satisfy the conditioning load and the first indentation depth, and fabricating the conditioning disk so that the determined structure of the tips of the conditioning disk is implemented. Here, determining the structure of the tips of the conditioning disk may mean determining at least one of the number, shape, dimension, and arrangement of the tips.

In some embodiments, the first indentation depth may be determined to be about 1.3 μm to about 2.3 μm when the shore hardness of the polishing pad is about 41 D to about 50 D and the conditioning load is about 4.5 lbf. In this case, the total area of the tips may be about 8 mm$^2$ to about 17.5 mm$^2$, and the total area of the tips may be determined through a combination of the number of tips and the dimension of the tip. When the total area of the tips is less than 8 mm$^2$, the first indentation depth exceeds 2.3 μm as pressure applied per tip increases, resulting in a sharp increase in the number of scratches on a polished wafer. Also, when the total area of the tips is greater than 17.5 mm$^2$, the first indentation depth becomes less than 1.3 μm as the pressure applied per tip decreases, and as a result, the number of scratches on the polished wafer may increase sharply.

In addition, the operation of fabricating the conditioning disk may include forming a base and a protruding pattern by processing a substrate, and depositing a coating layer on the protruding pattern by using a CVD process, as described above with reference to FIG. 3.

Next, the indentation depth of the prepared conditioning disk is measured, and it is determined whether the measured indentation depth is within a permissible range (operation S140). The indentation depth measuring apparatus described with reference to FIGS. 2A and 2B may be used to measure the indentation depth of the prepared conditioning disk.

In operation S140, if it is determined that the measured indentation depth is within the permissible range, a CMP process for polishing a wafer while performing a pad conditioning process by using the prepared conditioning disk is performed (operation S150). Specifically, to perform the CMP process, the polishing pad is attached onto a platen, and a disk holder with a conditioning disk mounted thereon is placed on the polishing pad. Then, the conditioning disk and the polishing pad rub against each other by applying a conditioning load to the conditioning disk through the disk holder. In this case, tips of the conditioning disk may be inserted into the polishing pad by a predetermined depth, and the tips of the conditioning disk in the inserted state finely cut the surface of the polishing pad as the conditioning disk and polishing pad rotate. Although an example in which the polishing pad and the conditioning disk rotate in the same direction (counterclockwise direction) is shown in FIG. 4, the polishing pad and the conditioning disk may rotate in opposite directions.

Alternatively, in operation S140, if it is determined that the measured indentation depth is outside the permissible range, the prepared conditioning disk may be determined to be unsuitable for performing an actual CMP process under a determined conditioning condition.

The CMP method according to the embodiment may calculate an indentation depth suitable for carrying out a CMP process having improved polishing characteristics. In addition, since the behavior of the CMP process may be predicted using the calculated indentation depth, whether the prepared conditioning disk is suitable for performing an efficient CMP process may be determined just by measuring a depth at which the tips of the prepared conditioning disk are inserted into the polishing pad. Accordingly, the cost of performing a CMP process to determine whether or not to use the prepared conditioning disk may be reduced.

Figure 8A:
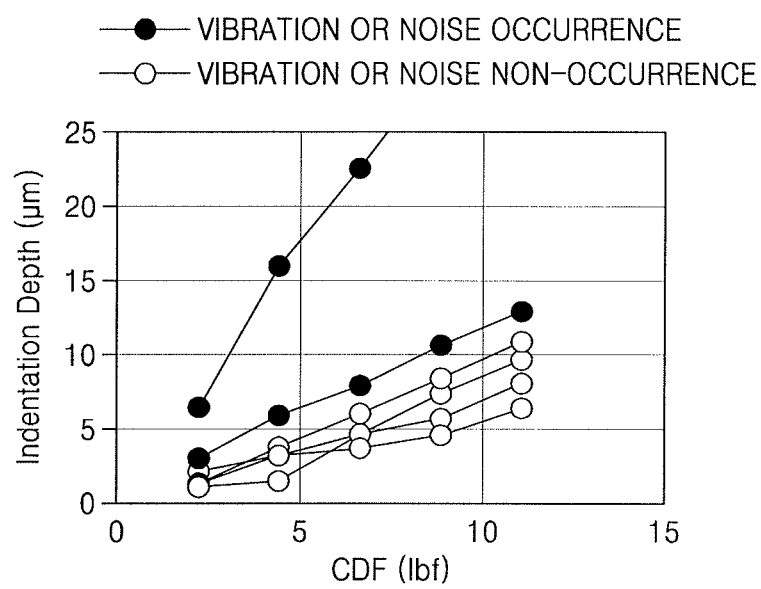
FIGS. 8A and 8B illustrate graphs showing vibration or noise occurrence according an indentation depth during a test CMP process according to some embodiments.
Figure 8B:
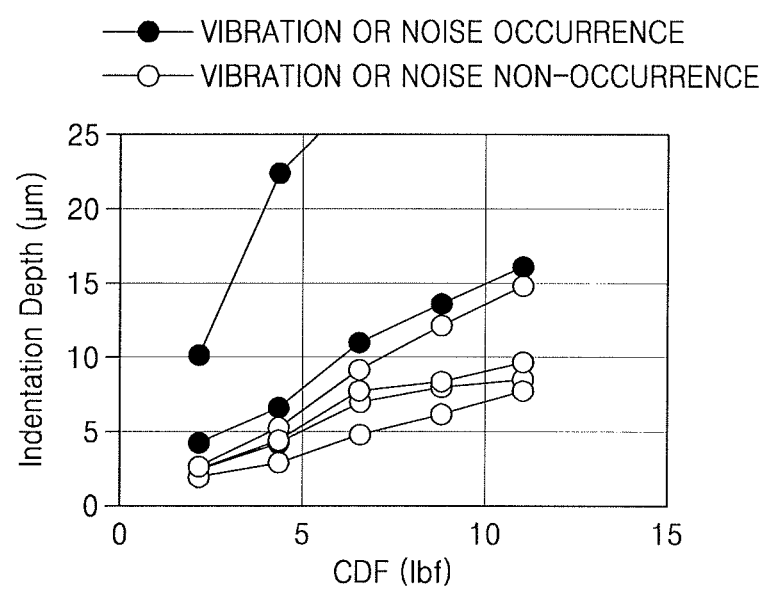

FIGS. 8A and 8B are graphs showing vibration or noise occurrence according an indentation depth during a test CMP process.

Figure 8C:
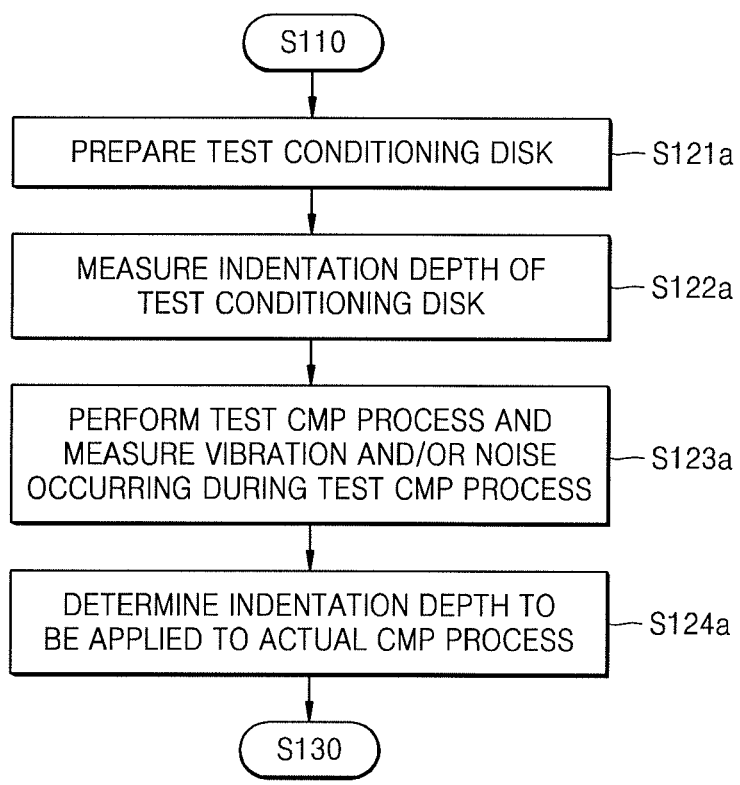
FIG. 8C illustrates a flowchart of a method of determining an indentation depth, according to some embodiments.

FIG. 8A shows vibration or noise occurrence during a test CMP process performed on a polishing pad having shore hardness of about 41 D to about 50 D depending on condition load and indentation depth. FIG. 8B shows vibration or noise occurrence during a test CMP process performed on a polishing pad having shore hardness of about 21 D to about 40 D depending on condition load and indentation depth. FIG. 8C is a flowchart sequentially illustrating a method of determining an indentation depth, according to some embodiments.

Hereinafter, the method of determining the indentation depth will be described with reference to FIG. 8C together with FIGS. 8A and 8B.

First, a plurality of test conditioning disks are prepared (operation S121a). The plurality of test conditioning disks may have tips that differ in at least one of the number, shape, dimension, and arrangement thereof. In FIGS. 8A and 8B, six test conditioning disks are illustratively prepared.

Next, for each of the plurality of test conditioning disks, an indentation depth according to a load, i.e., a conditioning down force (CDF), is measured (operation S122a). Since the plurality of test conditioning disks have tips of different structures, the plurality of test conditioning disks may be inserted into a polishing pad by different indentation depths when the same load is applied to the plurality of test conditioning disks. The indentation depth of each of the test conditioning disks may be measured while changing the load. To measure the indentation depth, the indentation depth measuring apparatus described with reference to FIGS. 2A and 2B may be used.

Next, a test CMP process is performed using the plurality of test conditioning disks, and vibration and/or noise occurring during the test CMP process is measured (operation S123a). In this case, when the level of the measured vibration exceeds a reference value, it is determined that vibration has occurred, or when the level of the measured noise exceeds a reference value, it is determined that noise has occurred.

An indentation depth to be applied to an actual CMP process is determined based on vibration occurrence information and/or noise occurrence information, obtained from the test CMP process, and indentation depth information according to the load of the test conditioning disks (operation S124a).

Specifically, as shown in FIGS. 8A and 8B, indentation depths are measured differently according to test conditioning disks even when the same load is applied to the test conditioning disks. When the measured indentation depth exceeds a specific value, vibration or noise occurs. That is, when tips of a conditioning disk are inserted into a polishing pad by a certain depth or more, friction between the polishing pad and the tips of the conditioning disk occurs excessively, resulting in the occurrence of vibration or noise. Through information on the occurrence of the vibration or noise, it may be predicted that a CMP process will be unstable.

As a result, as shown in FIG. 8A, when the polishing pad has shore hardness of about 41 D to about 50 D, an indentation depth for performing an efficient CMP process is determined to be about 1.5 µm or less when a load of 2.5 lbf is applied, about 4 µm or less when a load of 4.5 lbf is applied, about 6 µm or less when a load of 6 lbf is applied, about 8 µm or less when a load of 9 lbf is applied, and about 10 µm or less when a load of 11 lbf is applied.

As shown in FIG. 8B, when the polishing pad has shore hardness of about 21 D to about 40 D, an indentation depth for performing an efficient CMP process is determined to be about 1.5 µm or less when a load of 2.5 lbf is applied, about 5.5 µm or less when a load of 4.5 lbf is applied, about 7.5 µm or less when a load of 6 lbf is applied, about 12.5 µm or less when a load of 9 lbf is applied, and about 15 µm or less when a load of 11 lbf is applied.

FIGS. 9A to 9D are graphs showing results obtained by analyzing the wear rate of a polishing pad, the surface roughness of the polishing pad, the removal rate of a wafer, and the scratch occurrence degree of the wafer, respectively, according to indentation depth.

FIGS. 9A to 9D show the wear rate of the polishing pad, the surface roughness of the polishing pad, the removal rate of the wafer, and the scratch occurrence degree of the wafer, respectively, according to indentation depth when a load applied to a conditioning disk during a pad conditioning process is 4.5 lbf and the polishing pad has a hardness of about 41 D to about 50 D.

Figure 9A:
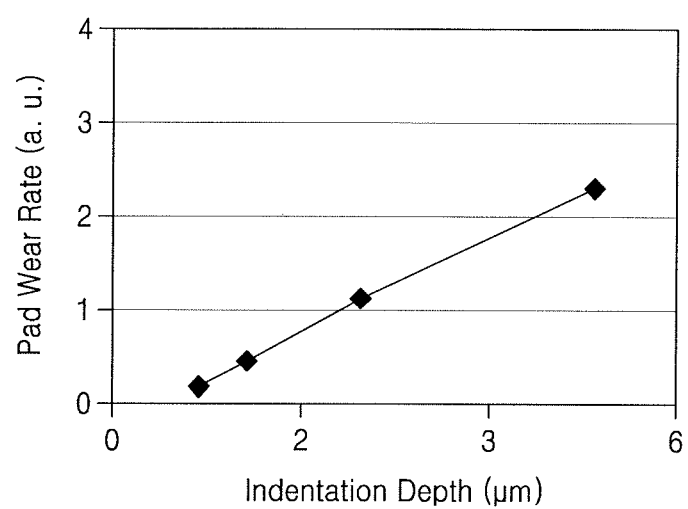
FIGS. 9A to 9D illustrate graphs showing results obtained by analyzing the wear rate of a polishing pad, the surface roughness of the polishing pad, the removal rate of a wafer, and the scratch occurrence degree of the wafer, respectively, according to indentation depth according to some embodiments.
Figure 9B:
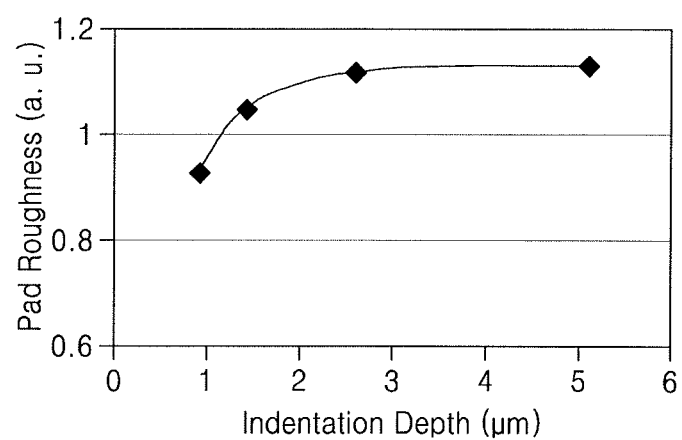

Referring to FIGS. 9A and 9B, it may be understood that process characteristics of the polishing pad are changed as the indentation depth is changed. Specifically, the wear rate of the polishing pad is approximately proportional to the indentation depth, and the surface roughness of the polishing pad converges to a specific value after increasing as the indentation depth increases. This indicates that the indentation depth directly affects surface characteristics of the polishing pad.

Figure 9C:
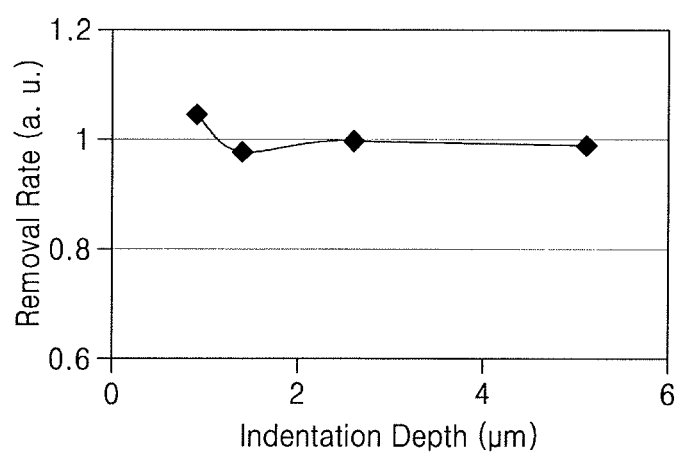
Figure 9D:
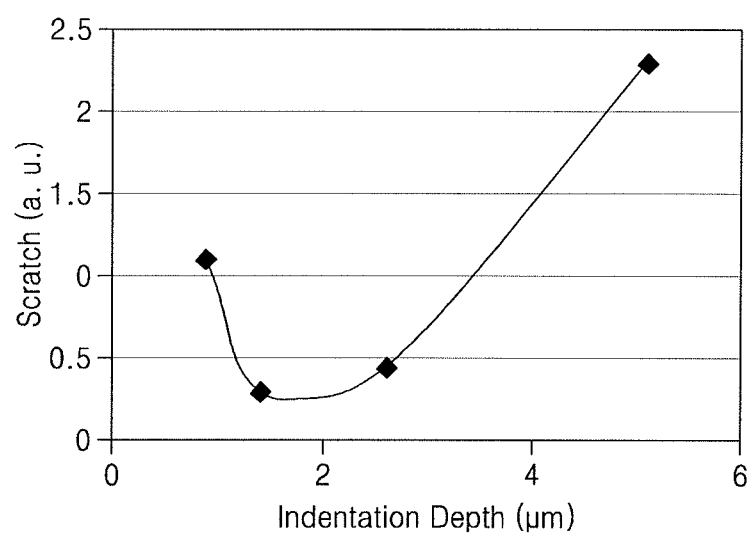

Referring to FIGS. 9C and 9D, as the indentation depth is changed, characteristics of a wafer subjected to a CMP process vary. Specifically, the removal rate of the wafer is generally constant, but the scratch occurrence degree of the wafer does not behave monotonously. Particularly, the scratch occurrence rate of the wafer decreases until the indentation depth increases to a specific indentation depth, and then increases again after the specific indentation depth. That is, by determining the specific indentation depth, a chemical mechanical polishing having a low scratch characteristic can be performed.

Figure 9E:
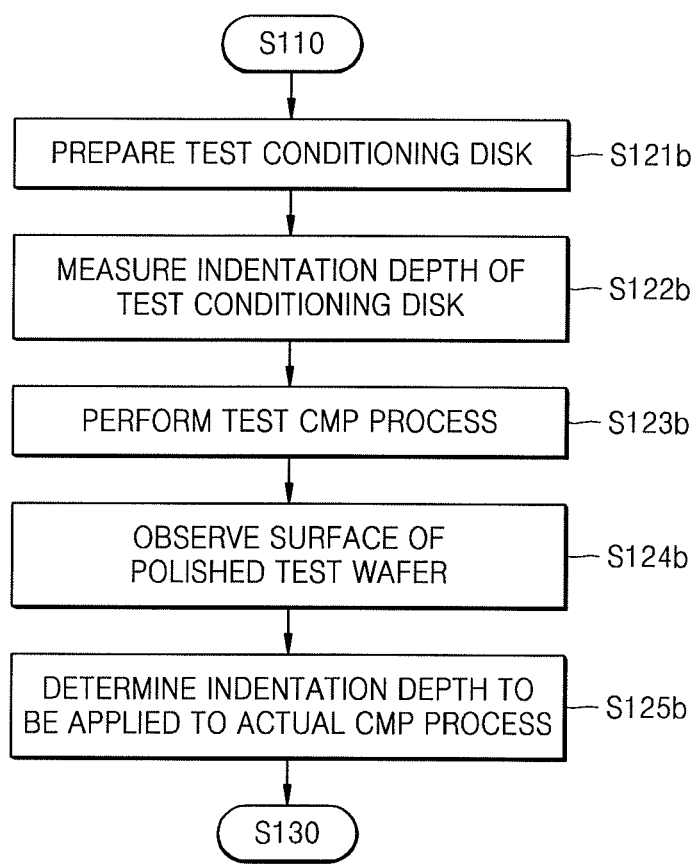
FIG. 9E illustrates a flowchart of a method of determining an indentation depth, according to some embodiments.

FIG. 9E is a flowchart sequentially illustrating a method of determining an indentation depth, according to some embodiments.

Hereinafter, with reference to FIG. 9E and FIG. 9D, the method of determining the indentation depth will be described.

First, a plurality of test conditioning disks are prepared (operation S121b). Tips of the plurality of test conditioning disks may have different structures. For example, the tips may differ in at least one of the number, shape, dimension, and arrangement of the tips.

Next, after the same load is applied to the plurality of test conditioning disks, a depth at which each of the test conditioning disks is inserted into a polishing pad is measured (operation S122b). In this case, since the plurality of test conditioning disks have tips having different structures, the measured indentation depths may be different from each other.

Next, a test CMP process is performed using the plurality of test conditioning disks (operation S123b).

Subsequently, the surfaces of test wafers polished through the test CMP process are observed (operation S124b). For example, by observing the surfaces of the test wafers, the number of scratches observed at the surfaces of the test wafers may be measured.

An indentation depth to be applied to an actual CMP process is determined using indentation depth information of the test conditioning disks and information on the number of scratches of the surfaces of the test wafers (operation S125b).

Specifically, as shown in FIG. 9D, scratch occurrence information according to the indentation depth may be generated. Accordingly, the indentation depth to be applied to the actual CMP process may be determined by obtaining an indentation depth when the smallest number of scratch is observed. As shown in FIG. 9D, the scratch occurrence rate sharply increases at a specific indentation depth or more and sharply decreases at a specific indentation depth or less, and thus it is necessary to set a permissible range of the indentation depth to be applied to an actual CMP process.

In some embodiments, an indentation depth when the degree of occurrence of scratches is equal to or less than a certain value may be determined as a permissible range, or the permissible range may be determined by adding a predetermined tolerance to an indentation depth corresponding to when there are the fewest number of scratches.

As a result, as shown in FIG. 9D, when the shore hardness of the polishing pad is about 41 D to 50 D and a conditioning load is 4.5 lbf, the scratch occurrence degree of a wafer surface is lowest when the indentation depth is about 1.8 µm. In some embodiments, when the shore hardness of the polishing pad is about 41 D to 50 D and a conditioning load is 4.5 lbf, the permissible range of an indentation depth to be applied to an actual CMP process may be 1.3 µm to 2.3 µm.

FIGS. 10A to 10D are side cross-sectional views sequentially illustrating a method of manufacturing a semiconductor device, according to some embodiments.

Figure 10A:
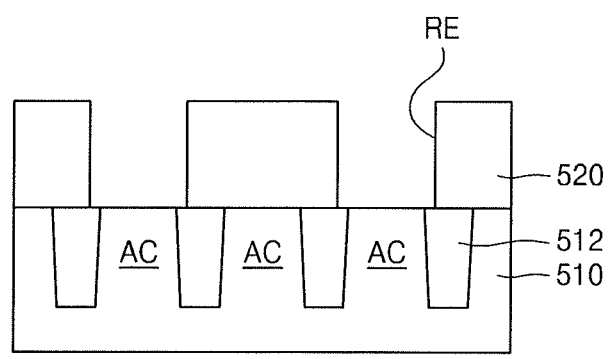
FIGS. 10A to 10D illustrate side cross-sectional views of stages in a method of manufacturing a semiconductor device, according to some embodiments.
Figure 10A:
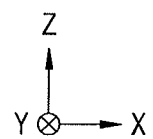

Referring to FIG. 10A, a patterned interlayer insulating film 520 may be formed on a substrate 510 including a plurality of active regions AC to at least partially expose the plurality of active regions AC. The interlayer insulating layer 520 may include a recessed portion RE exposing the active region AC. The recessed portion RE may be a contact hole or may be in the form of a trench. Although the case where the recessed portion RE is a contact hole is described here, it will be understood by those skilled in the art that the same technical idea may be applied to the form of a trench.

The substrate 510 may include a semiconductor, e.g., Si or Ge, or a compound semiconductor, e.g., SiGe, SiC, GaAs, InAs, or InP. In some embodiments, the substrate 510 may include at least one of a Group III-V material and a Group IV material. The Group III-V material may be a binary, ternary, or quaternary compound including at least one Group III atom and at least one Group V atom. The Group III-V material may be a compound including at least one atom of In, Ga, and Al as a Group III atom and at least one atom of As, P, and Sb as a Group V atom. For example, the Group III-V material may be selected from InP, $InZGa1-zAs$ ($0 \leq z \leq 1$), and $AlZGa1-zAs$ ($0 \leq z \leq 1$). The binary compound may be, e.g., any one selected from InP, GaAs, InAs, InSb and GaSb. The ternary compound may be, e.g., any one from InGaP, InGaAs, AlInAs, InGaSb, GaAsSb and GaAsP. The Group IV material may be, e.g., Si or Ge. However, the Group III-V material and the Group IV material that may be used in an integrated circuit device according to an embodiment are not limited to those described above. In another example, the substrate 510 may have, e.g., a silicon on insulator (SOI) structure. The substrate 510 may include a conductive region, e.g., a well doped with impurities or a structure doped with impurities.

The plurality of active regions AC may be defined by a plurality of device isolation regions 512 formed in the substrate 510. The device isolation regions 512 may include, e.g., a silicon oxide layer, a silicon nitride layer, a silicon oxynitride layer, or a combination thereof. The interlayer insulating layer 520 may include a silicon oxide layer.

Figure 10B:
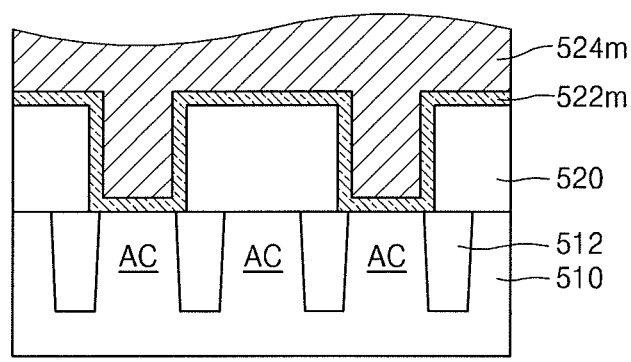

Referring to FIG. 10B, a barrier metal material layer 522m may be formed on the entire upper surface of the interlayer insulating layer 520 and the interior of the recessed portion RE. The barrier metal material layer 522m may be formed by, e.g., atomic layer deposition (ALD), chemical vapor deposition (CVD), or physical vapor deposition (PVD). The barrier metal material layer 522m may include, e.g., Ti and/or TiN.

A conductive material layer 524m may be formed on the entire upper surface of the barrier metal material layer 522m. The conductive material layer 524m may include, e.g., tungsten (W), and may be formed, e.g., by CVD.

Figure 10C:
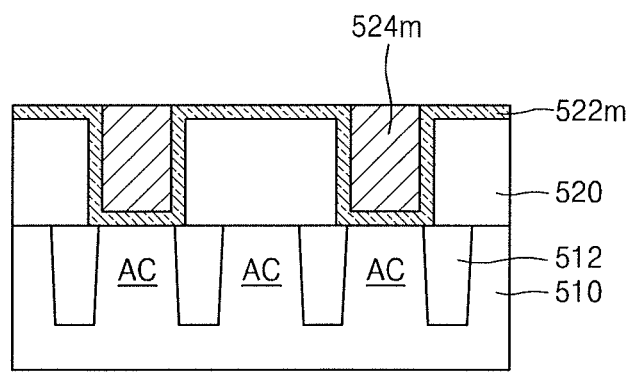

Referring to FIG. 10C, a CMP process may be performed on the conductive material layer 524m to confine the conductive material layer 524m in the recessed portion RE. In this case, the barrier metal material layer 522 may be used as a polishing stopper film.

Figure 10D:
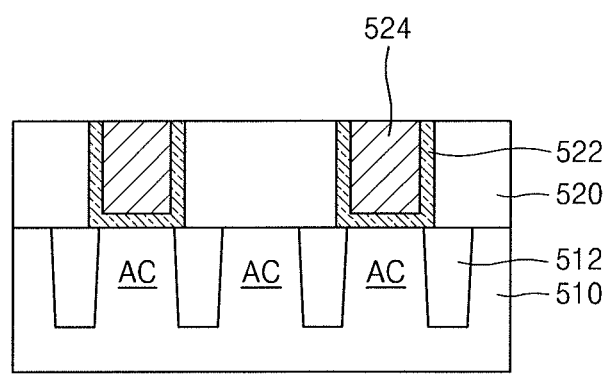
Figure 10D:
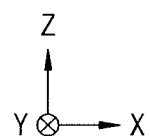

Referring to FIG. 10D, a CMP process may be performed on the exposed barrier metal material layer 522m to confine the barrier metal material layer 522 in each contact hole and to perform complete node isolation between contact holes.

In FIGS. 10C and 10D, a two-step CMP process in which each of the barrier metal material layer 522m and the interlayer insulating layer 520 is used as a polishing stop layer is performed as an example. However, in some embodiments, a CMP process may be performed in a single step by using only the interlayer insulating layer 520 as a polishing stop layer. The plurality of conductive regions 524 may be connected to one terminal of a switching element (not shown) such as a field effect transistor formed on the substrate 510. The plurality of conductive regions 524 may include polysilicon, a metal, a conductive metal nitride, a metal silicide, or a combination thereof, but is not limited thereto.

The CMP process performed in FIGS. 10C and 10D may be performed through the CMP method described with reference to FIGS. 7 to 9D. Accordingly, defects, e.g., scratches, on the surface of a polished material layer, e.g., the conductive material layer 524m, may be minimized.

By way of summation and review, embodiments provide a chemical mechanical polishing (CMP) method having improved polishing characteristics. Embodiments also provide a method of manufacturing a semiconductor device by using the CMP method. Embodiments also provide a semiconductor manufacturing apparatus capable of performing a CMP process having improved polishing characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A chemical mechanical polishing (CMP) method, comprising:
   preparing a polishing pad;
   determining a first load to be applied to a conditioning disk during conditioning of the polishing pad and a first indentation depth at which tips of the conditioning disk are inserted into the polishing pad when the first load is applied to the conditioning disk;
   preparing the conditioning disk; and
   positioning the conditioning disk on the polishing pad and conditioning a surface of the polishing pad by using the conditioning disk while applying the first load to the conditioning disk,
   wherein determining the first indentation depth includes measuring an indentation depth of the tips of the conditioning disk when the first load is applied to the conditioning disk.

2. The CMP method as claimed in claim 1, wherein determining the first indentation depth includes:
   preparing a plurality of test conditioning disks having tips of different structures;
   measuring an indentation depth of each of the test conditioning disks when the first load is applied thereto; and
   observing surfaces of test wafers polished through a test CMP process,
   wherein a test wafer having a smallest number of scratches is detected as a result of the observing, a test conditioning disk used in the test CMP process for the detected test wafer is detected, and an indentation depth of the detected test conditioning disk when the first load is applied thereto is determined as the first indentation depth.

3. The CMP method as claimed in claim 2, wherein when the polishing pad has a shore hardness of about 41D to about 50D and the first load is about 4.5 lbf, the first indentation depth is about 1.3 µm to about 2.3 µm.

4. The CMP method as claimed in claim 1, wherein determining the first indentation depth includes:
   preparing a plurality of test conditioning disks having tips of different structures;
   measuring an indentation depth of each of the test conditioning disks when the first load is applied thereto; and
   performing a test CMP process on each of the test conditioning disks while measuring vibration or noise,
   wherein test conditioning disks used in a test CMP process in which the measured vibration or noise is equal to or less than a reference value is detected, a maximum value of indentation depths of the detected test conditioning disks when the first load is applied thereto is determined, and the first indentation depth is determined to be equal to or less than the maximum value.

5. The CMP method as claimed in claim 4, wherein when the polishing pad has a shore hardness of about 41D to about 50D, the first indentation depth is equal to or less than about 1.5 µm when the first load is 2.5 lbf, is equal to or less than about 4 µm when the first load is 4.5 lbf, is equal to or less than about 6 µm when the first load is 6 lbf, is equal to or less than about 8 µm when the first load is 9 lbf, or is equal to or less than about 10 µm when the first load is 11 lbf.

6. The CMP method as claimed in claim 4, wherein when the polishing pad has a shore hardness of about 21D to about 40D, the first indentation depth is equal to or less than about 1.5 µm when the first load is 2.5 lbf, is equal to or less than about 5.5 µm when the first load is 4.5 lbf, is equal to or less than about 7.5 µm when the first load is 6 lbf, is equal to or less than about 12.5 µm when the first load is 9 lbf, or is equal to or less than about 15 µm when the first load is 11 lbf.

7. The CMP method as claimed in claim 1, wherein preparing the conditioning disk includes:
   determining a structure of the tips so that the conditioning disk has the first indentation depth when the first load is applied to the conditioning disk; and
   fabricating a conditioning disk having the determined structure of the tips.

8. The CMP method as claimed in claim 7, wherein determining the structure of the tips includes determining a number, shape, dimension, and arrangement of the tips.

9. The CMP method as claimed in claim 7, wherein when the polishing pad has a shore hardness of about 41D to about 50D and the first load is 4.5 lbf, a total area of the tips is about 8 mm2 to about 17.5 mm2.

10. The CMP method as claimed in claim 7, wherein an interval between the tips is within about 0.1 mm to about 2 mm.

11. The CMP method as claimed in claim 7, wherein the tips include first tips having a first height and second tips having a second height different from the first height.

12. The CMP method as claimed in claim 7, wherein the tips are disposed over an entire bottom surface of the conditioning disk.

13. The CMP method as claimed in claim 7, wherein the tips are locally disposed in an edge region of a bottom surface of the conditioning disk.

14. The CMP method as claimed in claim 7, wherein the tips are arranged at regular intervals.

15. The CMP method as claimed in claim 7, wherein an interval between tips disposed in a central region of a bottom surface of the conditioning disk is greater than an interval between tips disposed in an edge region of the bottom surface of the conditioning disk.

16. The CMP method as claimed in claim 7, wherein fabricating the conditioning disk includes:
   processing a substrate to form a base and a protruding pattern protruding from one side of the base; and
   forming a coating layer covering the protruding pattern.

17. The CMP method as claimed in claim 1, wherein, after preparing the conditioning disk, the CMP method further comprises:
   positioning the conditioning disk on the polishing pad and applying the first load to the conditioning disk to measure a first depth at which the tips of the conditioning disk are inserted into the polishing pad;
   comparing the first depth with the first indentation depth; and
   performing a chemical mechanical polishing (CMP) in accordance with the first indentation depth.

* * * * *